United States Patent
Shvydun et al.

(10) Patent No.: US 8,873,318 B2
(45) Date of Patent: *Oct. 28, 2014

(54) MECHANISMS FOR BUILT-IN SELF REPAIR OF MEMORY DEVICES USING FAILED BIT MAPS AND OBVIOUS REPAIRS

(75) Inventors: Volodymyr Shvydun, Los Altos, CA (US); Saman M. I. Adham, Ontario (CA)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 419 days.

This patent is subject to a terminal disclaimer.

(21) Appl. No.: 13/291,707

(22) Filed: Nov. 8, 2011

(65) Prior Publication Data

US 2013/0021860 A1  Jan. 24, 2013

Related U.S. Application Data

(60) Provisional application No. 61/509,832, filed on Jul. 20, 2011.

(51) Int. Cl.
G11C 7/00 (2006.01)
G11C 29/00 (2006.01)
G11C 29/44 (2006.01)
G11C 29/04 (2006.01)

(52) U.S. Cl.
CPC .... *G11C 29/4401* (2013.01); *G11C 2029/4402* (2013.01); *G11C 2029/0401* (2013.01); *G11C 29/72* (2013.01)
USPC ............................ 365/200; 365/201; 365/154

(58) Field of Classification Search
USPC ................ 365/200, 201, 154, 230.03, 185.09
See application file for complete search history.

(56) References Cited

U.S. PATENT DOCUMENTS 7,768,847 B2 * 8/2010 Ong et al. ...................... 365/200
8,509,014 B2 * 8/2013 Shvydun et al. .............. 365/200

* cited by examiner

*Primary Examiner* — David Lam
(74) *Attorney, Agent, or Firm* — Lowe Hauptman & Ham, LLP

(57) ABSTRACT

Failure bit map (FBM) data and a built-in-self-test-repair (BISTR) module enable collecting and analyzing FBM data of an entire memory to identify the best repairing method (or mechanism) to make repairs. As a result, the repair method is better and more efficient than algorithms (or methods) known to the inventors, which only utilize partial (or incomplete) failure data. At the same time, the compressed data structures used for the FBMs keep the resources used to capture the FBM data and to repair the failed cells relatively limited.

20 Claims, 10 Drawing Sheets

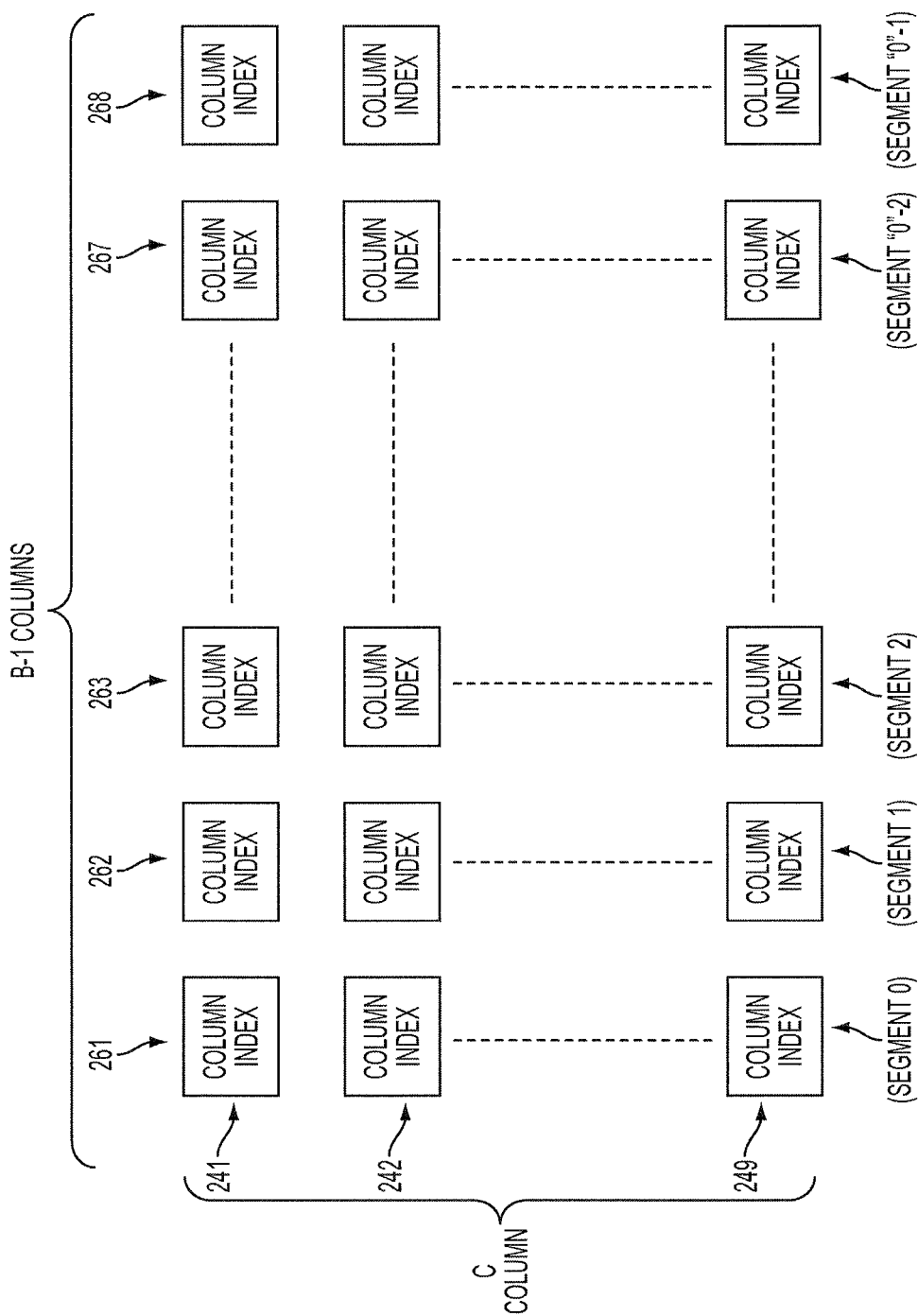

US 8,873,318 B2

MECHANISMS FOR BUILT-IN SELF REPAIR OF MEMORY DEVICES USING FAILED BIT MAPS AND OBVIOUS REPAIRS

CLAIM OF PRIORITY

The present application claims the priority of U.S. Provisional Application No. 61/509,832, entitled "Mechanisms for Built-in Self Test and Repair for Memory Devices" and filed on Jul. 20, 2011, which is incorporated herein by reference in its entirety.

CROSS REFERENCES TO RELATED APPLICATIONS

The present application is related to U.S. application No. 61/509,832, entitled "Mechanisms for Built-In Self Repair of Memory Devices," and U.S. application Ser. No. 13/291,620, U.S. Pat. No. 8,509,014, entitled "Mechanisms for Built-In Self Repair of Memory Devices Using Failed Bit Maps and Obvious Repairs", both of which are filed on the same day of this application and are incorporated herein by reference in their entireties.

FIELD

The present disclosure relates generally to self-testing and self-repairing of memories.

BACKGROUND

Integrated circuits have become key components of many consumer and commercial electronic products, often replacing discrete components and enhancing functionality. The semiconductor processing technologies that produce these integrated circuits have advanced to the point wherein complete systems, including memories, can be reduced to a single integrated circuit, which can be an application specific integrated (ASIC) device or a system-on-a-chip (SOC) device.

Embedded random access memory (RAM) is among the most widely used cores in current ASIC or SOC implementations. Embedded RAM gives rise to two particular problems during chip manufacturing. Because an embedded RAM occupies a significant portion of a chip's area, the probability that a defect lies within the RAM is relatively high. The RAM thus becomes a controlling factor in chip yield. Second, the embedding of RAM not only makes its own testing difficult, but also impairs testability of all other functions on chip, such as the core logic.

BRIEF DESCRIPTION OF THE DRAWINGS

FIG. 2C shows another FBM data structure, in accordance with some embodiments.

DETAILED DESCRIPTION

Figure 1A:
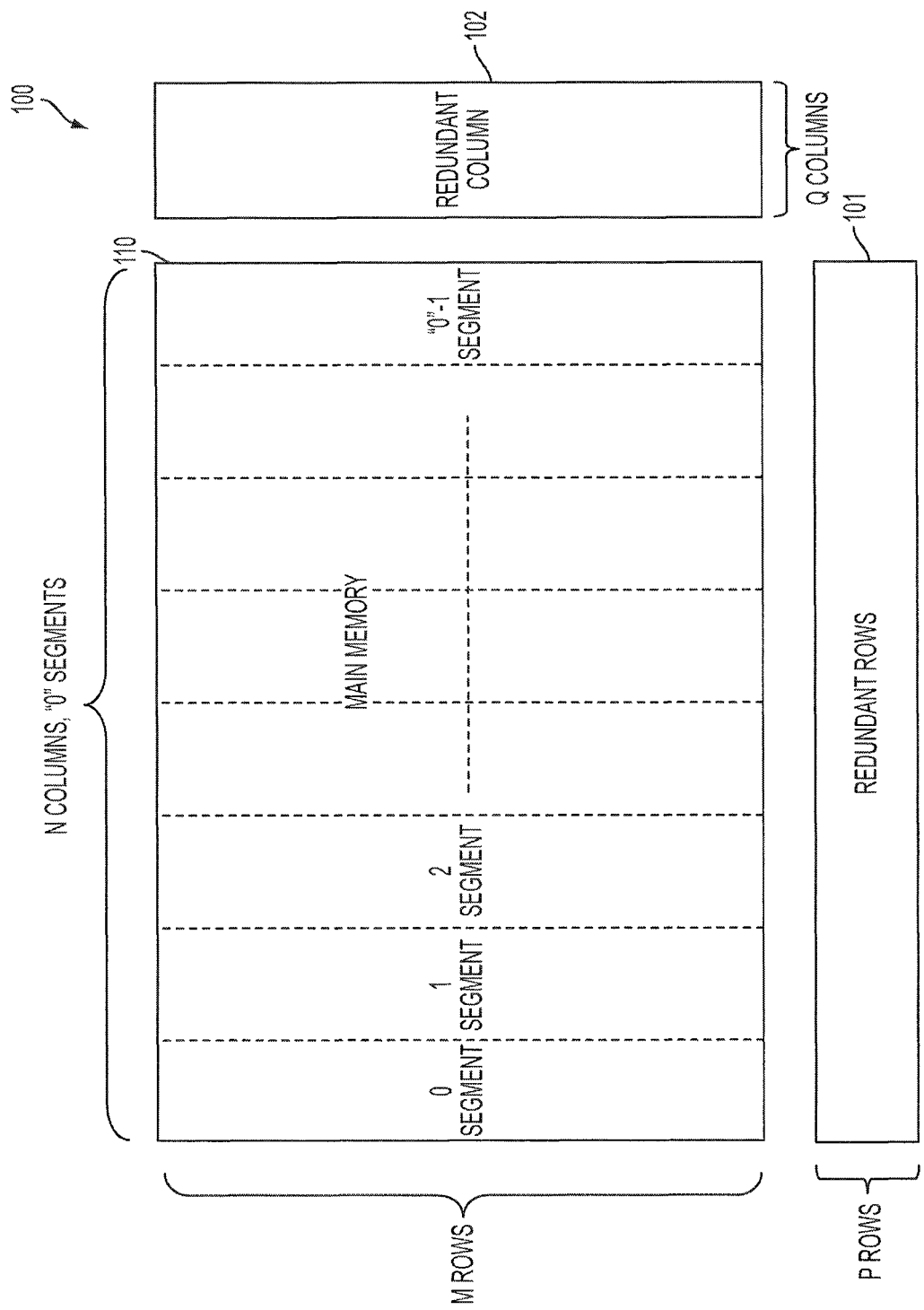
FIG. 1A shows a memory array with redundant rows and columns, in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

As mentioned above, the defect concern in the embedded RAM make testing necessary. In addition, the embedding of RAM not only makes its own testing difficult, but also impairs testability of all other functions on chip, such as the core logic. For example, much of the testing of other functions requires the use of the embedded RAM, which must be functioning properly. The RAM yield problems may be tackled by incorporating a repair scheme with redundant rows and/or columns. If an embedded memory is buried deeply within an ASIC or SOC device, built-in self-test (BIST) and built-in self-repair (BISR) have been used to assist memory repair. However, there are limitations of the existing BIST and BISR mechanisms to meet the requirement of memory repair for advanced devices.

FIG. 1A shows a memory array 100 with redundant rows and columns, in accordance with some embodiments. The memory array 100 could be a part of a memory chip or could be a part of an ASIC or SOC device. Memory array 100 includes a main memory 110, redundant rows 101 and redundant columns 102. The main memory 110 has M rows and N columns. M and N can be any integer number. The values of M and N determine the size of the main memory 110. For example, the main memory 110 may have 288 columns and 512 rows. Other numbers of columns and rows are also possible. In some embodiments, the main memory 110 may be further divided into a number of segments, such as O segments. O can be any integer number. In some embodiments, the segments are equal in size. For example, main memory 110 could have 8 segments, which are divided by columns. Using the exemplary main memory 110 described above, each segment has 36 columns if there are 288 columns and 8 segments. FIG. 1A shows that the main memory 110 has 0, 1, 2, ... "O"−1 segments.

The redundant rows 101 and the redundant columns 102 are rows and columns of memory cells that are used for repairing failed cells in the main memory 110. In some embodiments, the redundant rows 101 are used for row repair and the redundant columns 102 are used for column repair. The numbers of redundant rows 101 and columns 102 depend on the size of main memory 110 and also on the manufacturing processes used to make main memory 110 and its size. Larger main memory 110 (with more rows and columns) may require more redundant rows and columns to assist in cell repair. In addition, if the processes used to manufacture the device have high yield, the numbers of redundant rows and columns could be lower. In contrast, if the processes have low yield, the numbers of redundant rows and columns needed would be higher. As shown in FIG. 1A, the main memory 110 has P redundant rows and Q redundant columns. P and Q are integers. P is smaller than M and Q is smaller than N, in accordance with some embodiments. For example, if there are 288 columns and 512 rows in main memory 110, there could be 16 redundant rows and 8 redundant columns. Other numbers of redundant rows or columns are also possible. In some embodiments, each redundant column is used to repair failed memory cell(s) in one designated segment. Under such circumstance, Q is equal to O. The memory cell described here may refer to a memory unit, which may comprise a number of transistors.

Figure 1B:
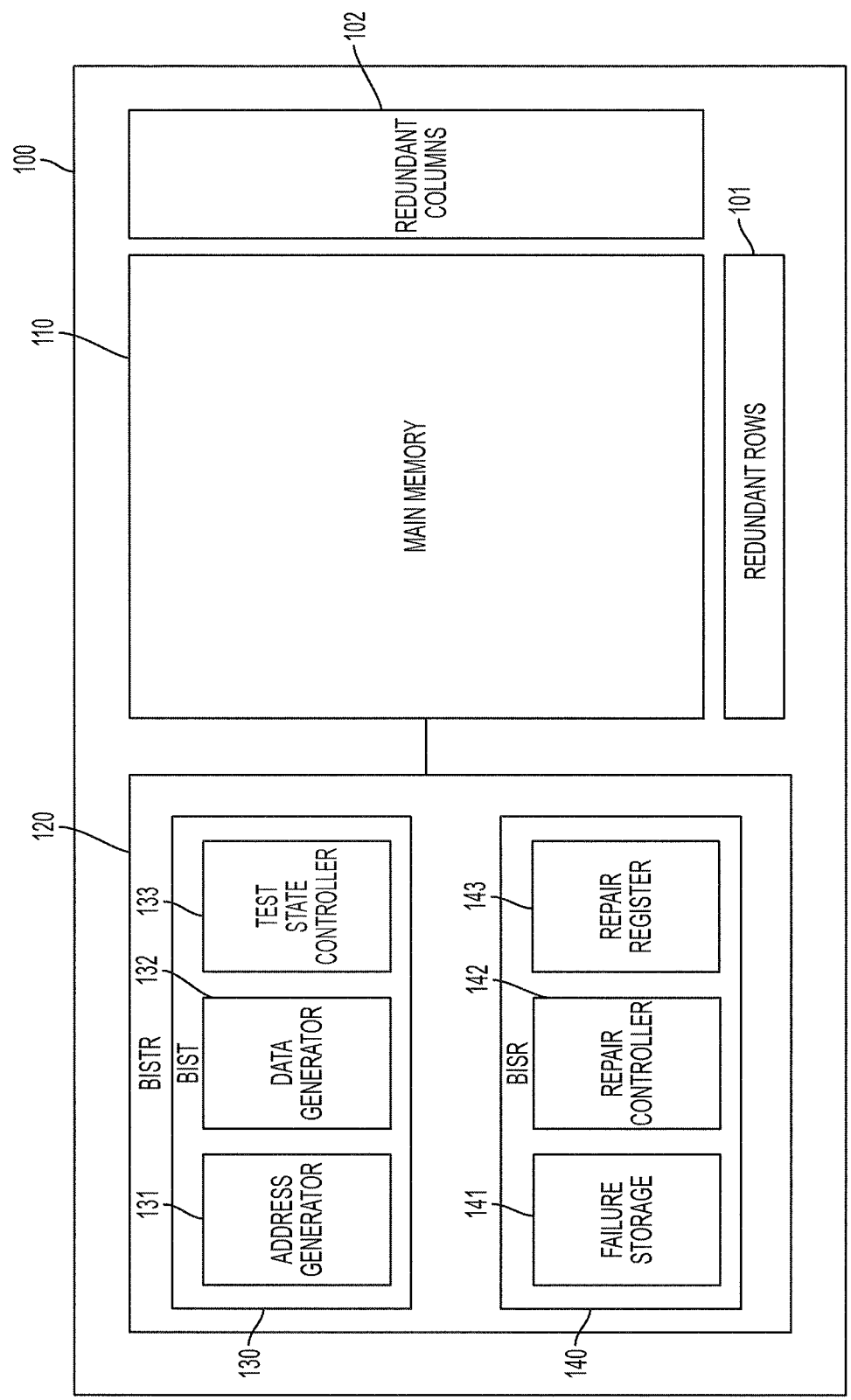
FIG. 1B shows a schematic diagram of a memory array with a built-in self-test-and-repair (BISTR) module, in accordance with some embodiments.

FIG. 1B shows a schematic diagram of the memory array 100 with a built-in self-test-and-repair (BISTR) module 120, in accordance with some embodiments. The BISTR module 120 provides the functions of testing and repairing main memory 110. The BISTR module 120 includes a BIST module 130 for testing the main memory 110 and a BISR module 140 for repairing the main memory 110, in accordance with some embodiments. The BIST module 130 may include an address generator 131, which generates and provides address sequences to the main memory 110 during testing in accordance with some embodiments. The BIST module 130 may further includes a data generator 132, which generates and provides test data sequences to the main memory 110 during testing. The address sequences and the data sequences are generated in orders specified by a test pattern algorithm, in some embodiments. The data sequences may provide a set of data bits to detect various types of faults within the main memory 110. In addition, the BIST module 130 may include a test state controller 133, which provides inputs and control signals to the address generator 131 and the data generator 132. The test pattern algorithm described above may be generated by the test state controller 133. The BIST module 130 may scan the main memory 110 by row, by column, or a combination of both to test the entire main memory 110.

The BISR module 140 may analyze the received error (or failure) data generated from testing the main memory 110. The error (or failure) data may include address(es) of the error(s) (or failed cells), also possibly along with the other received (or collected) error information, to determine the repair mechanism(s). Depending on the location and distribution of the error data, the repair could be done by row repair and/or column repair. The BISR module 140 may include a failure storage 141, which stores addresses of the failed memory cells. The failure storage 141 may also store the failure types associated with the failed memory cells. However, the storage of the failure types is not necessary.

The BISR module 140 may further include a repair controller 142 and a repair register 143. The repair controller 142 analyzes the failure data stored in failure storage 141 and determines the repair method(s), such as by row repair, by column repair, or by a combination of both. After the repair controller 142 determines the repair method(s), it issues a repair instruction to the repair register 143. The repair instruction may include the address(es) of row(s) and/or column(s) in the main memory 110 being repaired and the address(es) of redundant row(s) and/or redundant column(s) used for the repair(s). The repair register 143 then records the addresses received from the repair controller 142. When the memory array 100 is operated under read or write mode, the read/write address(es) is first checked against the repair addresses stored in the repair register 143 to see if the read/write address(es) is included in the repair register 143. If the answer is yes, the read/write would be performed on correlated address(es) in the redundant row(s) or column(s) used for the repair.

The repair controller 142 may use a relatively simple "repair-on-the-go" algorithm to repair faulty memory cells. For example, the BISR module 140 may repair the detected failed memory cells as soon as they are discovered. As mentioned above, the BIST module 130 scans the main memory 110 and sends failure information to failure storage 141. The repair controller 142 may initiate repair based on the available failure data in the failure storage 141 before the scanning of the entire main memory 110 is completed. Such repair algorithm is relatively simple to implement and the failure storage 141 required is relatively small. For example, if the test sequences generated by the BIST module 130 identify a particular row of a failed cell, the failure location is sent to the failure storage 141. When the repair controller 142 detects such an error, the repair controller 142 could immediately initiate a row repair. Afterwards, the BISTR 120 continues with the scanning (and testing) and repairing of the remaining portion of the memory. One issue facing such a repair algorithm is that the repair methods used might not be ideal for the failure patterns of the main memory 110, because the repair method is determined based on limited failure data. For example, a row repair might have been used to repair a single error in a row before it is discovered that the column associated with one of the row failure has multiple failures. A column repair would have been a better choice. By using non-optimized or poor repair methods, the redundant rows and/or columns could run out before the entire main memory 110 is scanned. As a result, some failed cells might not be repaired due to lack of redundancy. The built-in self-test-and-repair of the main memory 110 would then be deemed to have failed and the main memory 110 is marked as un-repairable. Therefore, the simple "repair-on-the-go" algorithm is not ideal.

Figure 2A:
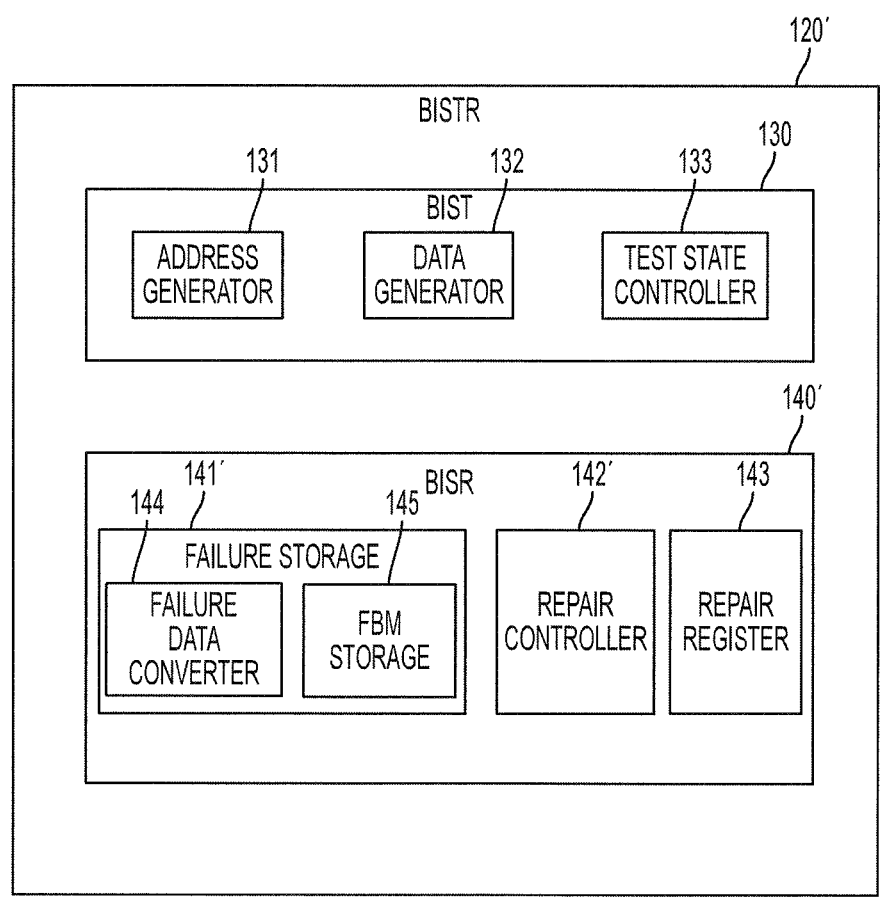
FIG. 2A shows a schematic diagram of a built-in self-test-and-repair (BISTR) module, in accordance with some other embodiments.
Figure 2B:
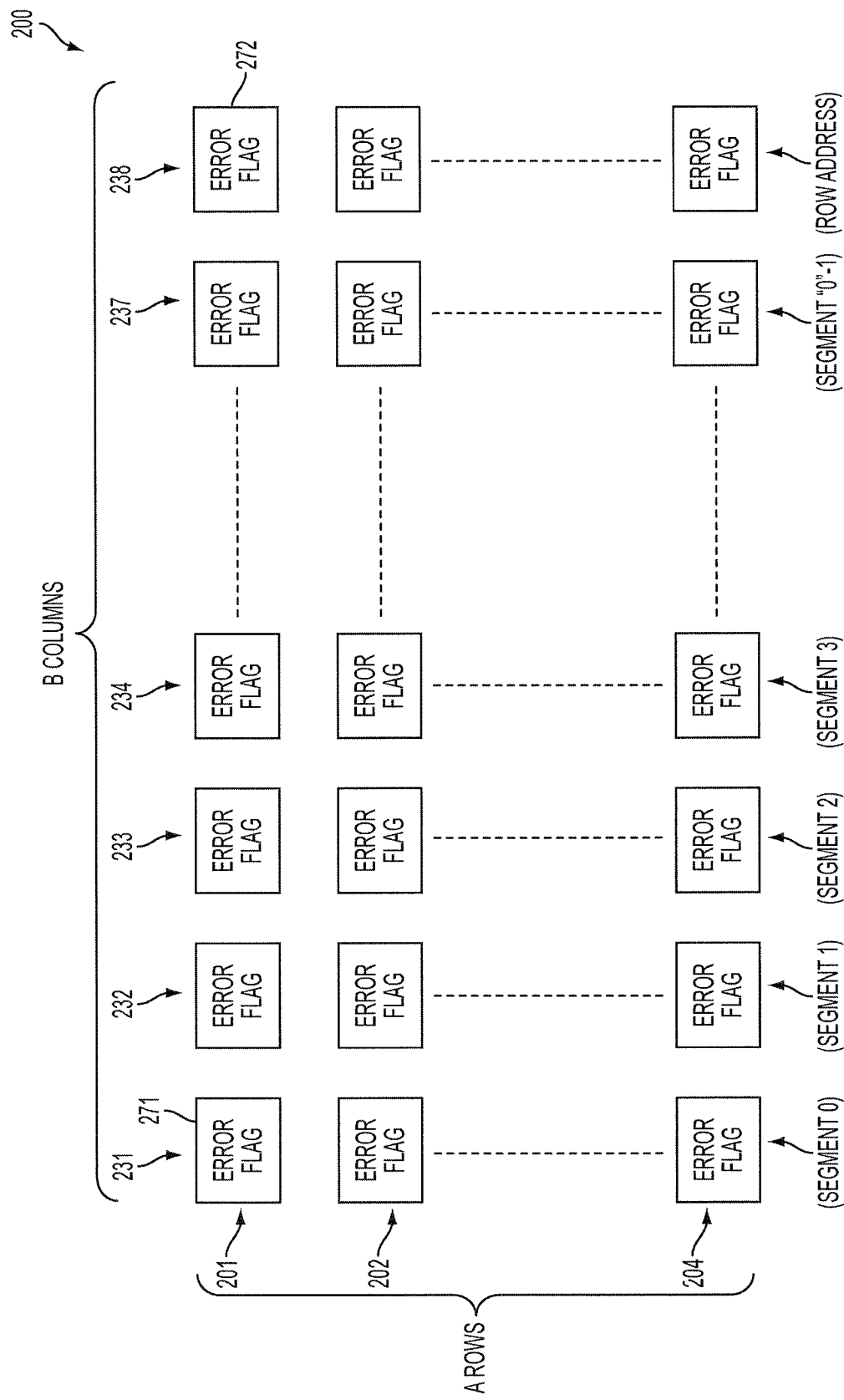
FIG. 2B shows a failure bit map (FBM) data structure, in accordance with some embodiments.

FIG. 2A shows a schematic diagram of a built-in self-test-and-repair (BISTR) module 120', in accordance with some embodiments. The BISTR module 120' may be used to test and repair main memory 110 in a manner similar to the BISTR module 120 described above in many aspects. For example, the BIST module 130 in the BISTR module 120' of FIG. 2A is similar to the memory BIST module 130 of FIG. 1B. However, the repair algorithm of BISR module 140' is different from the repair algorithm of the BISR module 140 described above. The BIST module 140' collects and analyzes one or more failure bit maps (FBMs), which store failure data of the entire main memory 110, before it determines the repair method(s). As shown in FIG. 2B, the BISR module 140' includes a failure storage 141', which includes a failure data converter 144 and a failure bit map (FBM) storage 145, in accordance with some embodiments. The failure data generated from BIST module 130 is stored in the FBM storage 145. To save the memory space required to save the entire main memory 110, the failure data stored in the FBM storage 145 are compressed failure data, which are generated (or converted) by the failure data converter 144 from failure data generated during the testing sequence of BIST 130.

The failure data stored in failure bit map (FBM) storage 145 are stored in bits. For example, if the main memory 110 has 288 columns with 8 segments, each segment has 36 columns, such as columns 0, 1, 2, . . . , 35. Six bits can be used to describe locations of 36 columns. FIG. 2B shows a FBM data structure 200, in accordance with some embodiments. The FBM data structure 200 includes "A" number of rows and "B" number of columns. A and B are both integers. Larger A and B allow storing more failure data with the down side of taking up extra memory space or additional real-estate on the chip. However, if the A and B are too small, it runs the risk of not being able to capture all failure data. In some embodiments, the A number is equal to or greater than the number of repair rows. The number B is equal to the number of repair column +1, in some embodiments. For example, the number A may be in a range from about 16 to about 50, and the number B may be in a range from about 8 to about 50. In some other embodiments, the number A is in a range from about 8 to about 50. Number B may be in a range from about 4 to about 100, in some embodiments.

For example, the FBM data structure 200 may has 28 rows and 9 columns. Using the example mentioned above with a main memory 110 having 288 columns and 8 segments, 8 out of the 9 columns are used to store error flags of failed cells in 8 segments. Each segment uses one of the 8 columns to record failure data in the segment. The extra column (the $9^{th}$ column) is used to store row addresses of failed cells, as shown in FIG. 2B in accordance with some embodiments. An error flag using "0" to represent no failure and "1" to represent a failure may be used. A single bit can be used to record failure or no-failure in a segment of a particular row. For example, an error flag in field 271 (or column 231 of row 201) is recorded with a "1" to reflect that there are one or more errors in a segment (segment 0) of a particular row. The memories used for such storage (single bit as error flag) are minimized. The row address of the error(s) in segment 0 is recorded in field 272 (or column 239 of row 201). The number of bits required to record the row address depends on the number of rows in the main memory 110. For example, if the main memory has 512 rows, 9 bits are needed to record the row address.

In addition to recording failures or no-failures in segments and rows, the locations (or address) of failed cells need to be recorded to enable repair. The FBM data structure 200 described above records the failed rows and segments. However, the FBM data structure 200 does not record the column addresses of failed cells. Therefore, another data structure, data structure 250, is used to record the column addresses of failed cells. Data structures 200 and 250 are used together to enable the determination of repair method and the repair work.

FIG. 2C shows data structure 250 for storing column addresses of failed cells, in accordance with some embodiments. For example, FBM data structure 250 may have 9 rows and 8 columns. The column addresses of failed cells are represented by column indexes, represented by bits. If the main memory 110 has 288 columns with 8 segments, each segment has 36 columns, such as columns 0, 1, 2, . . . , 35. 6 bits can be used to describe locations of 36 columns. FIG. 2C shows that the column address data structure 250 has C rows and B−1 columns, in accordance with some embodiments. C is an integer. The column address data structure 250 has one fewer column than data structure 200, because the column for recording the row addresses is not needed. For example, data structure 250 may have 9 rows and 8 columns. Each column is assigned to record column addresses of an assigned segment. For example, column 261 of data structure 250 is assigned to record column addresses of failed cells in segment 0, column 262 of data structure 250 is assigned to record column addresses of failed cells in segment 1, etc. In some embodiments, C is equal to A. However, C may be larger or smaller than A.

If there are more than one columns in a segment of a particular row that have errors, the column index may use a code, such as all 1s (111111) to reflect that there are more than 1 columns in the segment with errors for the particular row. In the example above, there are 36 columns in a segment. A column index of 111111 is not a column address for any of the columns in main memory 110. Therefore, it can be used to reflect that there is more than 1 column in the segment with errors on the particular row. However, other types of codes may also be used. In the example here, only one redundant column is available to repair a column fail in a segment. Since there is more than one failed column in a segment of a particular row (or having a segment violation), the repair needs to rely on the usage of redundant row(s), instead of using redundant column(s) for repair.

Figure 3A:
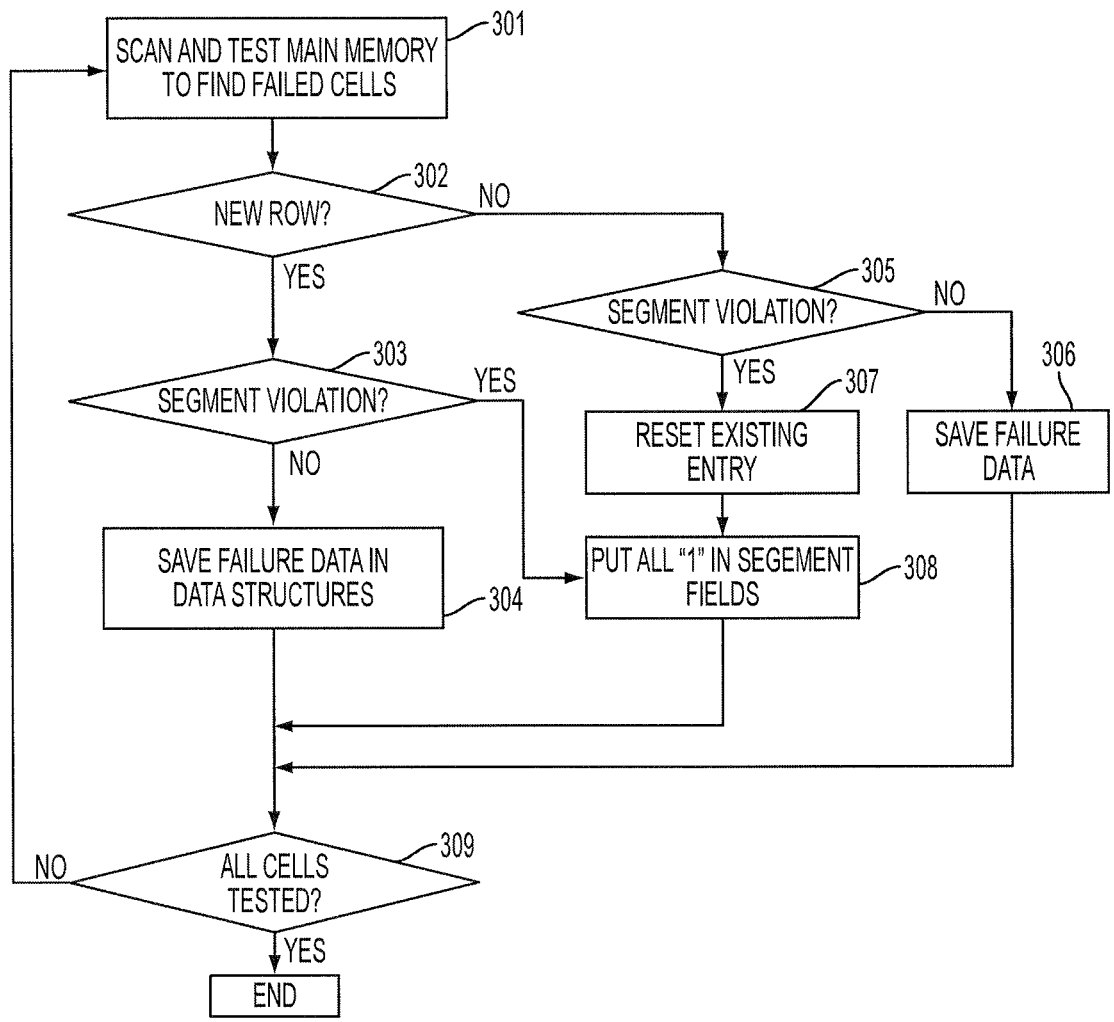
FIG. 3A shows a process flow of collecting data of failed cells of a main memory, in accordance with some embodiments.

The FBM data structures 200 and 250 are populated by the failure test results generated by BIST module 130. Once the failure bit maps (or data), including data structures 200 and 250, are collected, the repair controller 142' analyzes the failure data to determine the best repair mechanism. FIG. 3A shows a process flow 300 of collecting (or populating) failed bit map (FBM) data in the data structures 200 and 250, in accordance with some embodiments. At operation 301, main memory 110 is scanned and tested to find (or identify) failed cells. The memory cells of main memory 110 may be scanned by rows, by columns, or by a combination of rows and columns to identify failed memory cells. Once a memory cell is identified as a failed cell, a decision of whether the failed cell belongs to a new row (i.e. not existing in the data structure) is made at operation 302. If the failed cell belongs to a new row, process flow 300 moves to the next operation 303 of determining whether there is a segment violation(s) of the row. If the answer is "yes," process flow 300 proceeds to operation 308 of setting all segment fields of the row with segment violation to value "1" (or error flags of the row in data structure 200 set to 1) and the row address is recorded at operation 308 to identify the row to be repaired by row repair.

If the answer to the question in operation 303 is "no," the process moves to operation 304 of saving failure data in the data structures. For example, an error flag is placed in a field, such as field 271, in the data structure of FIG. 2B, for the segment of the failed cell and the row address, such as row address field 272 in column 239 of FIG. 2B, is recorded. In addition, the column index of the failed cell is entered into a field, such as field 281 of FIG. 2C, of a data structure for column addresses of failed cells. Afterwards, process flow 300 proceeds to operation 309 of determining if all memory cells have been tested. If they are all tested, the data collection process is completed (or comes to an end). If not, the process returns to operation 301 to scan and test additional memory cells in main memory 110.

If the answer is "no" to the question at operation 302 (i.e. not a new row), process flow 300 proceeds to operation 305 of determining if the failed cell(s) causes a segment violation. If the answer is "no", the failed cell is recorded in a field of FIG. 2B with an error flag and in a field of FIG. 2C with a column address at operation 306. If the answer at operation 305 is "yes" (i.e. there is a segment violation), the existing entry in data structure 250 related to the row is reset to "0" at operation 307 because the row will be repaired. In addition, all segment fields (in data structure 200) of the row with segment violation are reset to value "1" and the row address is identified at operation 308 to mark the row to be repaired by row repair.

Figure 3B:
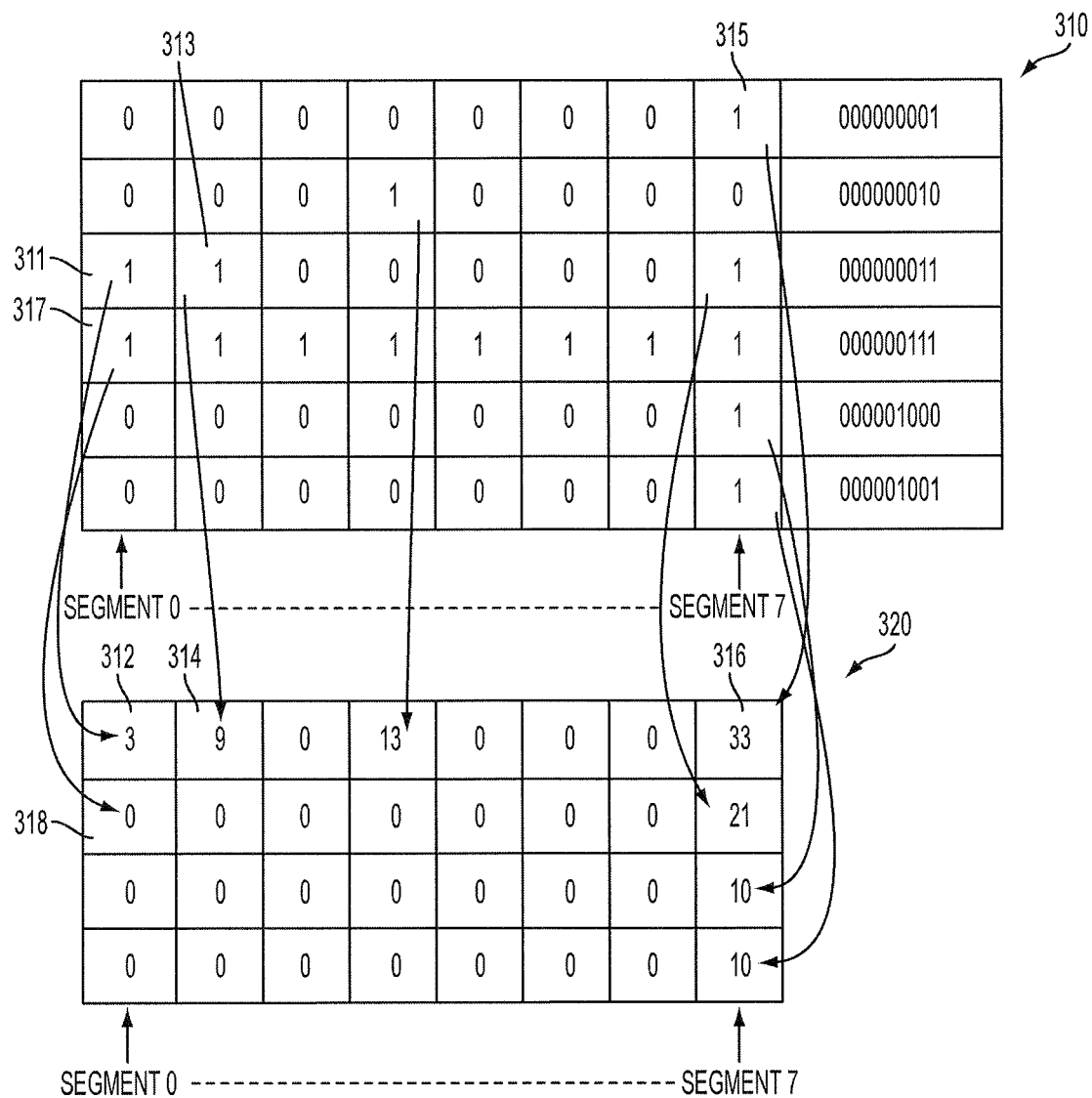
FIG. 3B shows two data structures used to store data of failed cells of the main memory, in accordance with some other embodiments.

FIG. 3B shows an exemplary FBM data Table 310 of FIG. 2B and column data Table 320 of FIG. 2C and the relationships of data, in accordance with some embodiments. FIG. 3B shows that field 311 of Table 310 correlates to field 312 of Table 320. The error (or failed cell) occurs in row address 000000011 (or column number 3). The "1" in field 311 is an error flag. The fields in Table 310 with error flags of "0" are segments in the rows on Table 310 without errors. The rows that are not listed in Table 310 also do not have errors. Similarly, fields 313 and 315 in Table 310 correlate to fields 314 and 316 in Table 310 respectively, as shown in FIG. 3B. FIG. 3B also shows that field 317 (for segment 0) of row 000000111 suffers from a segment violation. As a result, error flags are raised for all segments (or "1" is entered for all segments of row 000000111 in Table 310. Due to the segment violation, the column addresses of the segment with a segment violation are not entered in Table 320. As a result, field 318 of Table 320 is empty (reflected by 0 in this case).

Operations 304, 306 and 308 of FIG. 3A all proceed to operation 308, which determines if all cells in the main memory have been scanned (or tested). If the answer is yes, process flow 300 ends and the failure data collection is complete. If the answer is "no," process flow 300 returns to operation 301 to scan and test untested cells in main memory 110.

Figure 4A:
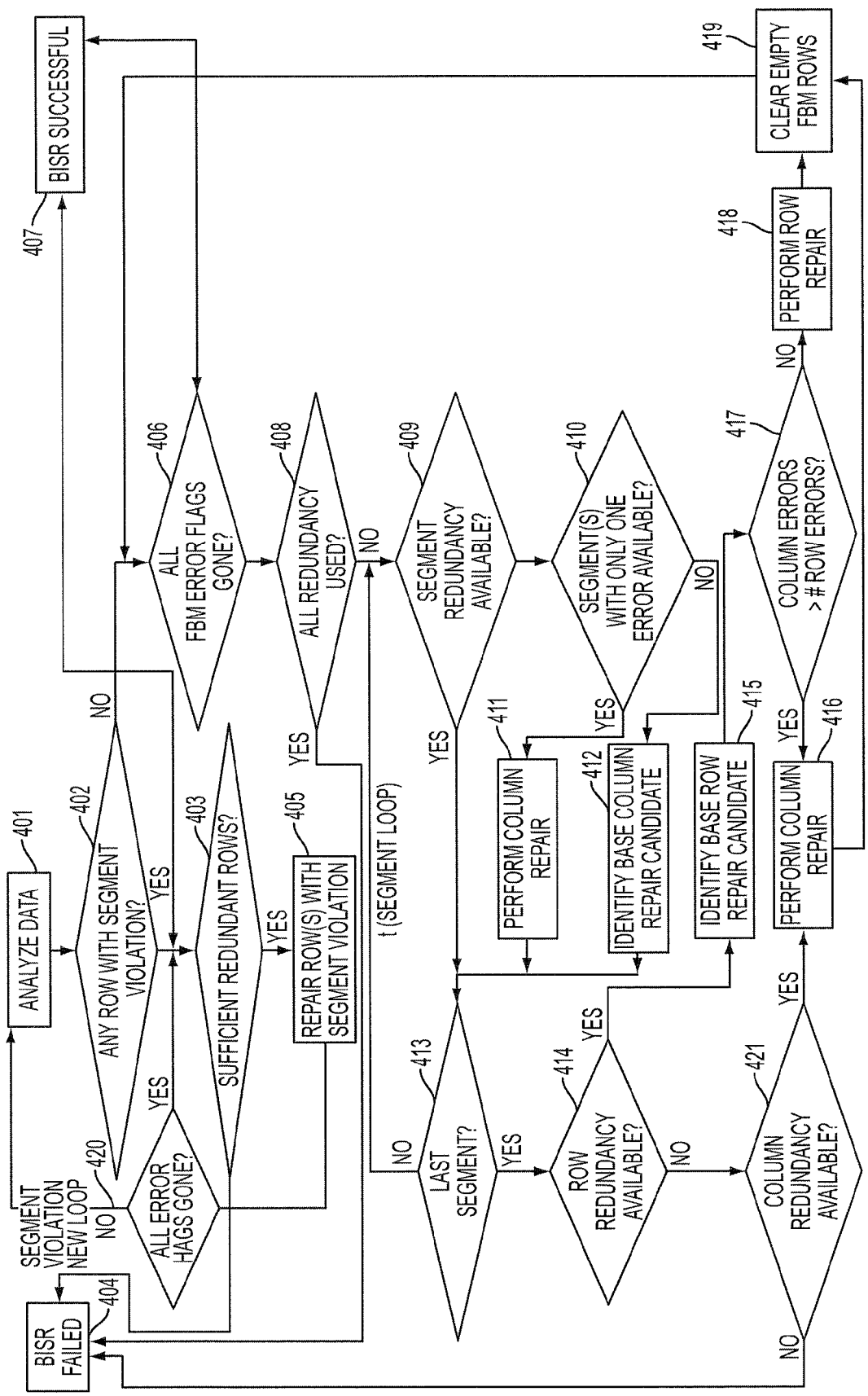
FIG. 4A shows a process flow of repairing failed cells of the main memory, in accordance with some embodiments.

After the failure data are collected, a repair algorithm is run against the data to determine the repair method(s), in accordance with some embodiments. As mentioned above, the self repair algorithm is stored in the repair controller 142', in accordance with some embodiments. FIG. 4A shows a process flow 400 of determining the repair method (or mechanism) for main memory 110, in accordance with some embodiments. Process flow 400 starts at operation 401 of analyzing the data in the data structures of FIGS. 2B and 2C. Afterwards, process flow 400 proceeds to operation 402 of determining if there is any row that has a segment violation. If the answer is yes, process flow 400 proceeds to operation 403 of determining if there is sufficient row redundancy (or redundant row or rows) to fix the segment violation(s) identified. If there is insufficient redundant row(s) to repair tow(s) with segment violation, the process proceeds to operation 404 of BISR having failed and the main memory 110 deemed not-repairable due to insufficient redundant row(s). Operation 404 ends the process flow 400. If there are sufficient redundant rows, process flow 400 proceeds to operation 405 of repairing the row(s) with a segment violation. The repair work may include marking the row(s) that is being repaired and also the redundant row(s) used for repairing the row. The repair work may also include clearing the data in the row(s) with a segment violation to remove all error flags in the row(s). For example, the segment fields of row 000000111 in Table 310 will be removed from Table 310 after the repair is done.

Afterwards, process flow 400 proceeds to operation 420 of determining if all error flags are removed. If the answer is yes, the self repair work is deemed successful and the process proceeds to operation 407, which also ends the process flow. If there are still errors in the data structures, process flow returns to operation 401 to analyze the revised data structures. The other outcome of operation 402 is that there are no rows with segment violation. If this is the case, process flow 400 proceeds to operation 406 of determining if all error flags have been removed. If the answer is yes, the self repair is successful and the process proceeds to operation 407 of successful BISR. If the answer is "no" at operation 406, process flow 400 proceeds to operation 408 of determining if all redundancy, which includes redundant rows and columns, has been used. If the answer is yes, the BISR has failed and process proceeds to operation 404. If the answer at operation 408 is no, process flow 400 proceeds to operation 409 of determining if segment redundancy (or redundant column(s)) is available or not. If the answer at operation 409 is "no," the process proceeds to operation 413 to determine if the segment studied is the last segment or not. During the BISR process, the segments are checked one by one. Operation 413 is used to determine if the segment loop has been completed or not.

If the answer for operation 413 is "no", the process returns to operation 409 to check on the status for the next segment. If the answer for operation 413 is yes, the process proceeds to operation 414, which will be described below. If the answer at operation 409 is a "yes," process flow 400 proceeds to operation 410, which identifies segment(s) with only one column error. The segment(s) with only one column error is repairable by a redundant column. Therefore, if the answer to the question at operation 410 is yes, column repair is applied at operation 411, which marks the column being repaired and the redundant column used for repairing. In addition, the segment data for all rows that are related to this repair are reset to "0" (or the error flags are removed). If the answer to the question at operation 410 is "no," process flow 400 proceeds to operation 412 of searching for a best column candidate for repair, i.e. identifying a column with the highest (or maximum) number of fails (or errors). Both operations 411 and 412 proceed to operation 413, whose function has been explained above.

As mentioned above, when the answer to the question at operation 413 is "yes," the process moves to operation 414, which determines if row redundancy is available. If the answer is "yes," process flow 400 proceeds to operation 415, which searches for the best row candidate for repair (or identifies a row(s) with a maximum number of errors). The operations after operation 415 will be described below. If the answer is "no" at operation 414, which means there is no redundant row, the process moves to operation 421 to check if there is column redundancy, or redundant column(s), available for repair. If the answer is also "no," the BISR has failed and the process moves to operation 404. If there is column redundancy, column repair is performed at operation 416. In some embodiments, repairing a column involves recording the addresses of both the repaired column and the redundant column used. The repairing also involves clearing the segment data of all rows in the repaired column. Afterwards, process flow 400 proceeds to operation 419 of clearing empty FBM rows in Table 310. The clearing work involves removing rows in the data structures without data (or are empty). Following operation 419, process flow 400 returns to operation 406 to determine if all FBM error flags have been removed.

After the best row candidate for row repair is identified at operation 415, process flow 400 proceeds to operation 417, which determines whether there are more column fails in a column or more row fails in a row to decide whether to perform column or row repair. If there are more column fails in the particular column, column repair is repaired at operation 416, which was described above. If there are more row errors, row repair is performed at operation 418. After operation 418, the process continues to operation 419. The process flow 400 described above is an embodiment of BISR using the data structures described in FIGS. 2B and 2C. Other variations of process flow 400 are also possible.

Figure 4B:
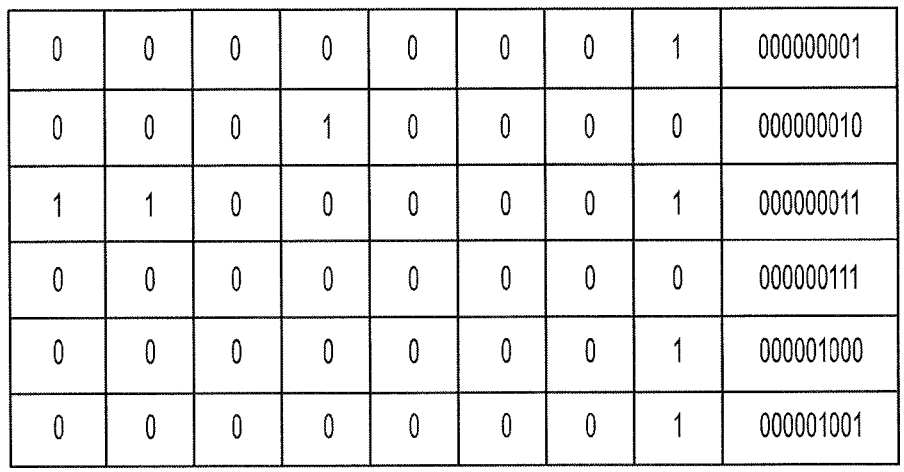
FIG. 4B shows exemplary data in FBM data structures used for determining a column with a maximum number of errors, in accordance with some embodiments.
Figure 4B:
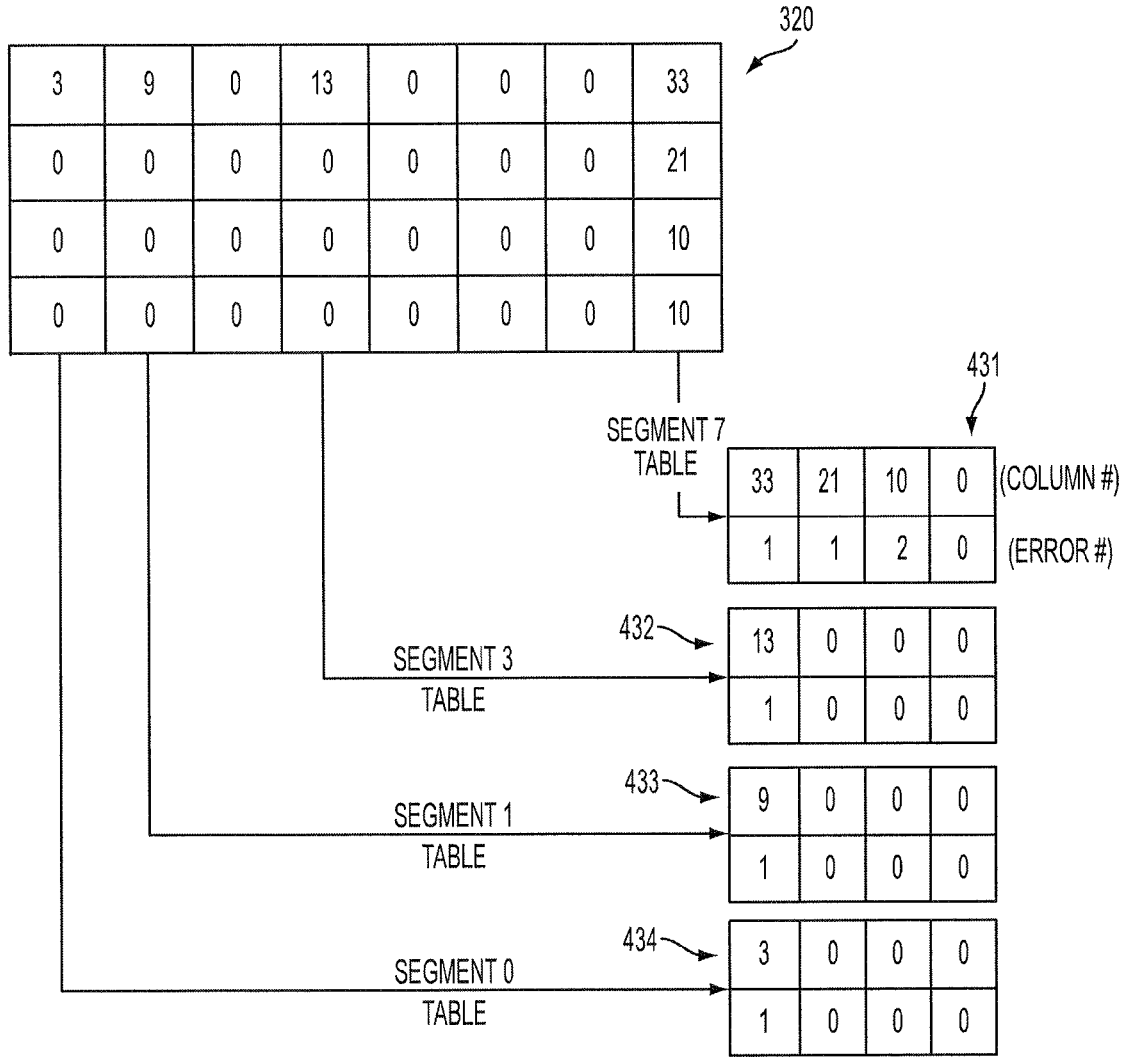

Operation 417 described above compares numbers of errors in a column and in a row to determine whether to conduct column repair or row repair. FIG. 4B shows exemplary data in data structures (or tables), which are used to perform the comparison. FIG. 4B shows the data from FIG. 3B, which are used to identify a column with a maximum number of errors. FIG. 4B shows that the segment data in Table 320 are reduced to 4 segment Tables 431, 432, 433, and 434. Table 431 includes errors in segment 7. The data in Table 431 includes 1 error in column 33, 1 error in column 21, and 2 errors in column 10. Table 432 shows an error in column 13 of segment 3. Table 433 shows 1 error in column 9 of segment 1 and Table 434 shows 1 error in column 3 of segment 0. FIG.

4B shows that in Table 310 the row with row index 000000111 (or row number 7) is marked with error flags in all segments with 0, since a row repair has been performed and all error flags have been cleared in Table 310'. The results show that column 10 in segment 7 has the highest number of errors (2).

The results in FIG. 4B show that by comparing the data in tables (or summaries) reduced from the data structures shown in FIGS. 2B and 2C, the address of the column (column 10 of segment 7) with the maximum number of errors can be identified, in accordance with some embodiments. However, the formation of Tables 431-434 is not necessary in getting such a conclusion. Algorithms without using such tables may also be used to reach such a conclusion. The operation that produces such analysis and result is operation 412 described above.

Figure 4C:
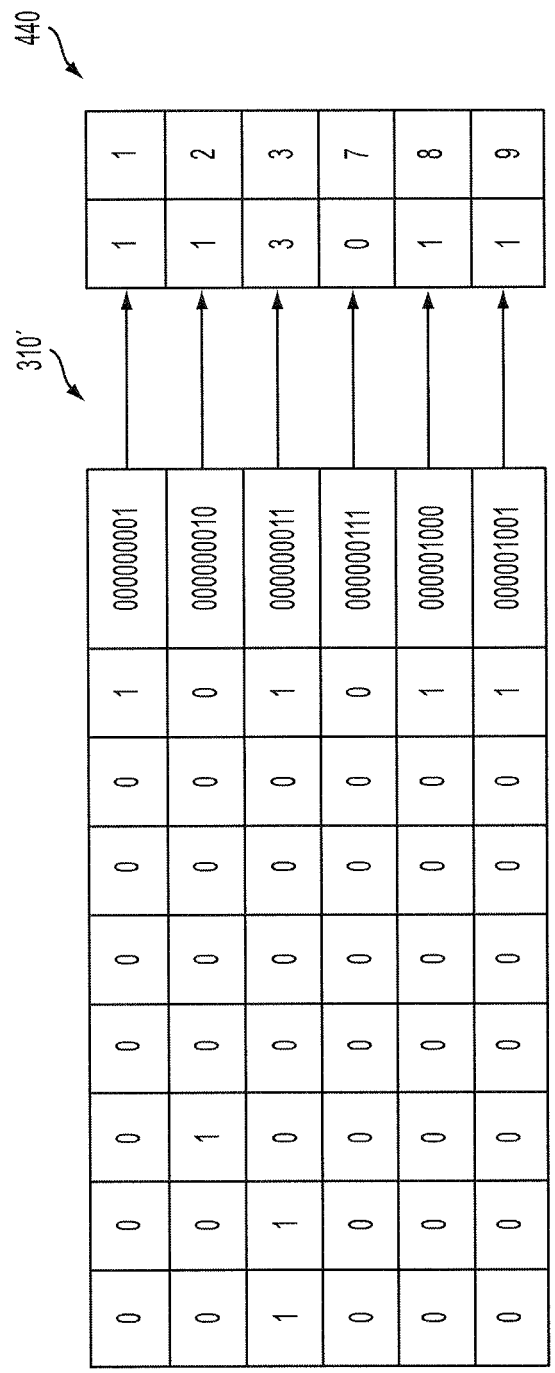
FIG. 4C shows exemplary data in a FBM data structure used for determining a row with a maximum number of errors, in accordance with some embodiments.

FIG. 4C shows failure data of Table 310' with the row addresses reduced to a table 440, in accordance with some embodiments. Table 450 is transformed from Table 430 after row repair has been performed in operation 405. Table 450 shows that row number 3 (or row index 000000011) has 3 errors, which is the highest number of row errors in Table 450. If the data of FIGS. 4B and 4C are compared to one another at operation 417, the maximum number of row errors is 3, which is larger than the maximum number of column errors (2). As a result, a row repair would be selected according to the algorithm.

The end result of method 400 is either a completely repaired main memory 110 or a non-repairable main memory 110. In some embodiments, the non-repairable main memory 110 is marked as a lower-grade memory with the addresses of un-repaired rows and/or columns recorded, if there are not too many of them, and can still be sold or used.

The embodiments of mechanisms described may be used to self-test and self-repair any type of RAM, including volatile and non-volatile memories, such as static RAM (SRAM), dynamic RAM (DRAM), or flash memory, etc. The built-in self repair analysis circuit is configurable (parameterizable) to support different sizes and configurations of memories. The repair solutions can be designed to optimize repair efficiency for memories with different sizes and configurations for different test time specifications and different available areas (for test and/or repair devices) on chips. Although the examples described above involve a redundant column for a segment, more than one redundant column may be reserved for a particular segment. When this occurs, the repair methods need to be adjusted accordingly. For example, the criteria of segment violation would be different with the number of columns with failures in a segment adjusted accordingly. Alternatively, rows can also be divided into segments and redundant rows can be assigned to dedicated segments.

The failure bit map (FBM) data and built-in-self-test-repair (BISTR) module described above enable collecting and analyzing FBM data of the entire memory to identify the best repairing method (or mechanism) to make repairs. As a result, the repair method is better and more efficient than algorithms (or methods) known to the inventors, which only utilize partial (or incomplete) failure data. At the same time, the compressed data structures used for the FBMs keep the resources used to capture the FBM data and to repair the failed cells relatively limited.

In some embodiments, a method of self-testing and self-repairing a random access memory (RAM) is provided. The method includes collecting failure data of the RAM with redundant rows and columns. The failure data of all failed cells of the RAM are stored in two failure bit map (FBM) data structures. The RAM is divided into a number of segments. The method also includes analyzing the failure data in the two FBM data structure to determine repair methods. The method further includes repairing failed cells of the RAM by using the redundant rows and columns until either all failed cells are repaired or the redundant rows and columns are all used.

In some other embodiments, a method of self-testing and self-repairing a random access memory (RAM) is provided. The method includes collecting failure data of the RAM with redundant rows and columns. The failure data of all failed cells of the RAM are stored in two failure bit map (FBM) data structures. The RAM is divided into a number of segments, and a first FBM data structure includes a column for row addresses and a plurality of columns for error flags. A second FBM data structure includes a plurality of columns for column indexes corresponding to column addresses of failed cells. The method also includes analyzing the failure data in the two FBM data structure to determine repair methods. The method further includes repairing failed cells of the RAM by using the redundant rows and columns until either all failed cells are repaired or the redundant rows and columns are all used.

In yet some other embodiments, a memory array with a built-in self-test (BIST) module and a built-in self-repair (BISR) module to repair a main memory of the memory array is provided. The memory array includes the main memory, and a first number of redundant rows for row repair of the main memory. The memory array also includes a second number of redundant columns for column repair of the main memory, and the main memory is evenly divided into the second number of segments. Each redundant column is assigned for column repair in an assigned segment. The memory array further includes the BIST module for testing the main memory, and the BISR module for repairing the main memory by using the redundant rows and redundant columns. The BISR module performs repair based on two failure bit maps (FBMs) generated from testing the entire main memory.

While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A method of self-testing and self-repairing a random access memory (RAM), comprising:
   collecting failure data of the RAM with redundant rows and columns, wherein the failure data of all failed cells of the RAM are stored in two failure bit map (FBM) data structures, and wherein the RAM is divided into a number of segments;
   analyzing the failure data in the two FBM data structure to determine repair methods; and
   repairing failed cells of the RAM by using the redundant rows and columns until either all failed cells are repaired or the redundant rows and columns are all used.

2. The method of claim 1, wherein a first FBM data structure includes a column for row addresses and a plurality of columns for error flags, and wherein a second FBM data structure include a plurality of columns for column indexes corresponding to column addresses of failed cells.

3. The method of claim 2, wherein each of the error flags is represented by a bit reflecting a pass or a fail.

4. The method of claim 1, wherein the number of redundant columns is equal to the number of segments, and wherein each redundant column is used for column repair in an assigned segment.

5. The method of claim 2, wherein the collecting failure data further comprises:
checking for a segment violation to identify segments with more than one column with failures on a particular row, and wherein an error flag of 1 is placed in each segment field of the plurality of columns for error flags.

6. The method of claim 1, wherein the analyzing the failure data in the two FBM data structure to determine repair method further comprises:
determining if there are sufficient redundant rows to repair rows with a segment violation.

7. The method of claim 1, wherein the analyzing the failure data in the two FBM data structure to determine repair method further comprises:
identifying segments with only one column fail for column repair.

8. The method of claim 1, wherein the analyzing the failure data in the two FBM data structure to determine repair method further comprises:
identifying a column with a first maximum number of fails;
identifying a row with a second maximum number of fails; and
comparing the first maximum number with the second maximum number to determine a larger number between the two maximum numbers; wherein the column or the row with the larger number is selected for repair.

9. The method of claim 2, further comprising:
clearing rows with no error flags in the first FBM data structure by removing the row from the first data structure.

10. The method of claim 1, wherein the method is configurable to optimize repair efficiency for the RAM with an available area for integrated circuits of the self-testing and self-repair method.

11. The method of claim 2, wherein row addresses, column addresses and column indexes are represented by bits.

12. The method of claim 1, wherein the collecting failure data of the RAM is enabled by a built-in self-test (BIST) module, and wherein the analyzing and the repairing are performed by a built-in self-repair (BIST) module, and wherein the BIST and the BISR modules are integrated with the RAM.

13. The method of claim 1, wherein the RAM is selected from a group consisting of static RAM (SRAM), dynamic RAM (DRAM), and flash memory.

14. The method of claim 1, wherein the repairing is performed by registering an address of a repaired row or column and the address of the redundant row or column used for the repair, and wherein the FBM data structures are updated after the repairing is performed.

15. A method of self-testing and self-repairing a random access memory (RAM), comprising:

collecting failure data of the RAM with redundant rows and columns, wherein the failure data of all failed cells of the RAM are stored in two failure bit map (FBM) data structures; and wherein the RAM is divided into a number of segments, wherein a first FBM data structure includes a column for row address and a plurality of columns for error flags, and wherein a second FBM data structure includes a plurality of columns for column indexes corresponding to column addresses of failed cells;
analyzing the failure data in the two FBM data structure to determine repair methods; and
repairing failed cells of the RAM by using the redundant rows and columns until either all failed cells are repaired or the redundant rows and columns are all used.

16. A memory array with a built-in self-test (BIST) and a built-in self-repair (BISR) modules to repair a main memory of the memory array, comprising:
the main memory;
a first number of redundant rows for row repair of the main memory;
a second number of redundant columns for column repair of the main memory, and wherein the main memory is evenly divided into the second number of segments and each redundant column is assigned for column repair in an assigned segment;
the BIST module for testing the main memory; and
the BISR module for repairing the main memory by using the redundant rows and redundant columns, and wherein the BISR module performs repair based on two failure bit maps (FBMs) generated from testing the entire main memory.

17. The memory array of claim 16, wherein the BIST module includes an address generator, a data generator, and a test state controller, wherein a test pattern controlled by the test state controller is generated by the address generator and the data generator.

18. The memory array of claim 16, wherein the BIST module includes a failure storage for storing failure data, a repair controller for analyzing the failure data to determine the repair method, and a repair register for registering the repaired rows and columns and the redundant columns and rows used, and wherein the failure storage includes the FBMs, and wherein the FBMs are updated after the repair is performed.

19. The memory array of claim 18, wherein the failure storage further includes a failure data converter, wherein the failure data converter generates compressed failure data to be stored in a data structure for the FBM.

20. The memory of claim 16, wherein the FBMs are stored in a first FBM data structure which includes a column for row address and a plurality of columns for error flags, and wherein a second FBM data structure includes a plurality of columns for column indexes corresponding to column addresses of failed cells.

* * * * *